(12) United States Patent
Kumar et al.

(10) Patent No.: US 6,217,655 B1
(45) Date of Patent: Apr. 17, 2001

(54) STAND-OFF PAD FOR SUPPORTING A WAFER ON A SUBSTRATE SUPPORT CHUCK

(75) Inventors: Ananda H. Kumar, Milpitas; Shamouil Shamouilian, San Jose, both of CA (US); Hyman J. Levinstein, Berkeley Heights, NJ (US); Vijay Parkhe, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/791,941

(22) Filed: Jan. 31, 1997

(51) Int. Cl.[7] ................................................. B05C 13/00
(52) U.S. Cl. ............................................. 118/500; 118/728
(58) Field of Search ................................ 118/715, 724, 118/725, 728, 500; 156/345

(56) References Cited

U.S. PATENT DOCUMENTS

| | | | |
|---|---|---|---|
| 4,502,094 | 2/1985 | Lewin et al. | 361/234 |
| 5,370,739 | * 12/1994 | Foster et al. | 118/725 |
| 5,529,657 | * 6/1996 | Ishii | 156/345 |
| 5,530,616 | 6/1996 | Kitabayashi et al. | 361/234 |
| 5,532,903 | 7/1996 | Kendall | 361/234 |
| 5,560,780 | 10/1996 | Wu et al. | 118/728 |
| 5,583,736 | 12/1996 | Anderson et al. | 361/234 |
| 5,745,332 | 4/1998 | Burkhart et al. | 361/234 |
| 5,764,471 | 6/1998 | Burkhart | 361/234 |
| 5,885,469 | * 3/1999 | Kholodenko et al. | 216/11 |

FOREIGN PATENT DOCUMENTS

| | | | |
|---|---|---|---|
| 0 794 566 | 9/1997 | (EP) | H01L/21/68 |
| 60261377 | 12/1985 | (JP) | H02N/13/00 |
| 62-157752 | 7/1987 | (JP) | B23Q/3/15 |
| 63-194345 | 8/1988 | (JP) | H01L/21/68 |
| 1-241839 | 9/1989 | (JP) | H01L/21/68 |
| 9-172055 | 6/1997 | (JP) | H01L/21/68 |

* cited by examiner

*Primary Examiner*—Richard Bueker
*Assistant Examiner*—Evin Fieler
(74) *Attorney, Agent, or Firm*—Thomason Moser Patterson

(57) ABSTRACT

A stand-off pad, and method of fabricating the same, for supporting a workpiece in a spaced apart relation to a workpiece support chuck. More specifically, the wafer stand-off pad is fabricated of a polymeric material, such as polyimide, which is disposed upon the support surface of the chuck. The stand-off pad maintains a wafer, or other workpiece, in a spaced apart relation to the support surface of the chuck. The distance between the underside surface of the wafer and the chuck is defined by the thickness of the stand-off pad. This distance should be larger than the expected diameter of contaminant particles that may lie on the surface of the chuck. In this manner, the contaminant particles do not adhere to the underside of the wafer during processing and the magnitude of the chucking voltage is maintained between the workpiece and the chuck.

11 Claims, 2 Drawing Sheets

STAND-OFF PAD FOR SUPPORTING A WAFER ON A SUBSTRATE SUPPORT CHUCK

BACKGROUND OF THE DISCLOSURE

1. Field of the Invention

The invention relates to a substrate support chuck within a semiconductor processing system. More particularly, the invention relates to a stand-off pad disposed upon the surface of a substrate support chuck for supporting a semiconductor wafer such that the surface of the wafer that faces the chuck is spaced-apart and substantially parallel to the surface of the chuck.

2. Description of the Background Art

Substrate support chucks are widely used to support substrates within a semiconductor processing system. A particular type of chuck used in high-temperature semiconductor processing systems, such as high-temperature physical vapor deposition (PVD), is a ceramic electrostatic chuck. These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. Additionally, the lapping process may fracture the surface of the chuck body. Consequently, as the chuck is used, particles are continuously produced by these fractures. Also, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Japanese Patent Application No. 60-261377, published Dec. 24, 1985, discloses a ceramic electrostatic chuck having an embossed support surface. The embossing reduces the surface area of the ceramic support that contacts the wafer. Consequently, the number of contaminant particles transferred to the wafer is reduced. However, such an embossed surface maintains some degree of contact between the ceramic material and the underside of the wafer. Thus, contamination, though reduced, is still substantial.

Similarly, substrate support chucks that are used in low-temperature processing (e.g., less than 300 degrees Celsius) may also produce contaminant particles that interfere with wafer processing. Such low-temperature chucks include electrostatic chucks and mechanical clamping chucks which contain wafer support surfaces that are typically fabricated from dielectric materials such as alumina. These types of chucks have also been found to produce particulate contaminants that can adhere to the underside of the wafer during processing.

Therefore, a need exists in the art for an apparatus that reduces the amount of contaminant particles that adhere to the underside of the wafer while supported upon a chuck.

SUMMARY OF THE INVENTION

The disadvantages of the prior art are overcome by the present invention of a stand-off pad for supporting a wafer, or other workpiece, in a spaced-apart relation to a chuck, or other workpiece support. More specifically, the invention is a stand-off pad disposed upon the support surface of the chuck. The material of the stand-off pad has superior contact properties as compared to the chuck surface material including being less abrasive and more compliant. The stand-off pad may be fabricated from polymeric materials such as polyimide, fluoropolymers, and the like.

The stand-off pad maintains a wafer, or other workpiece, in a spaced apart relation to the support surface of the chuck. The distance between the underside surface of the wafer and the chuck is defined by the thickness of the stand-off pad. This distance should be larger than the expected diameter of contaminant particles that may lie on the surface of the chuck. In this manner, the contaminant particles do not adhere to the underside of the wafer during processing.

In a specific embodiment of the invention, the wafer stand-off pad is comprised of a plurality of individual support pads (islands). The islands are fabricated by dispensing a solution of polymeric material using a drop dispenser on the surface of the chuck, then drying and curing the material.

In another embodiment of the invention, the wafer stand-off pad is formed by spin coating a polymer material onto the chuck and then selectively etching unwanted polymer material using an etch mask, and the like. The stand-off pad may also be fabricated by forming a pattern that is die cut from a sheet of polymeric material to yield a web pattern, i.e., a plurality of islands interconnected by connector strips. The stand-off pad may also be a predefined pattern such as a plurality of spaced-apart pads, radial strips, concentric rings, or a combination of radial strips and concentric rings.

In use, the web is placed on the ceramic surface or in a corresponding recess pattern formed in the surface of the chuck, and held thereon with an adhesive or by physical means (e.g., friction). With this configuration, the web can be removed for cleaning and replaced when worn.

As a result of using the invention during processing of semiconductor wafers, the number of particulate contaminants adhered to the underside of a wafer after processing has been reduced from tens of thousands of particles to hundreds of particles. This substantial improvement in particle count has significantly decreased the number of wafers that are found defective during processing. Additionally, while using the invention with electrostatic chucks current leakage through the wafer and chuck has been reduced due to the insulating characteristics of the polymer material of the wafer stand-off pad.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
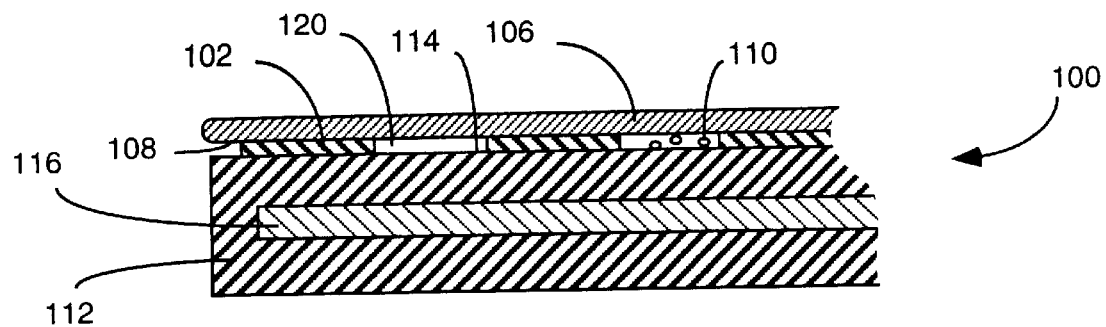
FIG. 1 depicts a cross-sectional view of a stand-off pad of the present invention, on the surface of a chuck, supporting a wafer.
Figure 2:
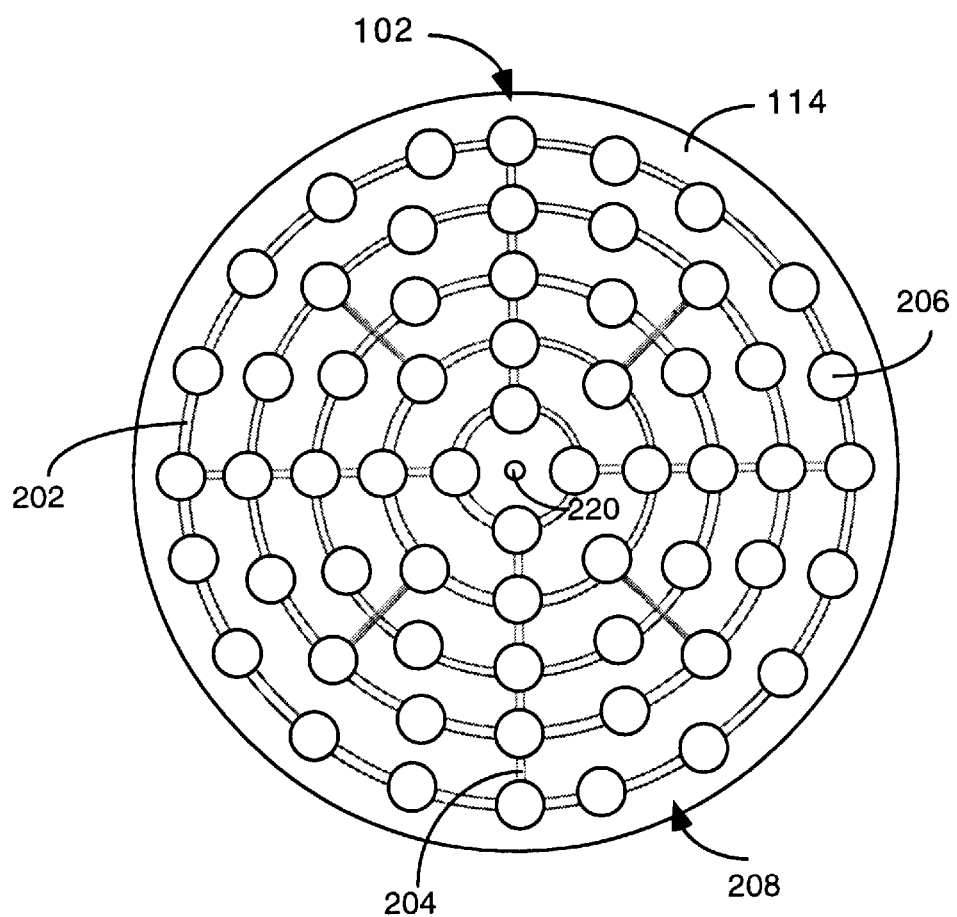
FIG. 2 depicts a top plan view of an illustrative pattern for the wafer stand-off pad.

FIG. 1 depicts a cross-sectional view of a wafer stand-off pad 102 of the present invention supporting a wafer 106 above a the surface 114 of an electrostatic chuck 100. To illustrate the use of the invention, FIG. 1 depicts the stand-off pad 102 supporting a semiconductor wafer 106. FIG. 2 depicts a top plan view of an illustrative pattern for the stand-off pad 102 of FIG. 1 (without the wafer 106). For best understanding of the invention, the reader should simultaneously refer to both FIGS. 1 and 2 while reading the following disclosure.

Although the preferred embodiment of the present invention is discussed as used in conjunction with a ceramic electrostatic chuck, the invention is also useful in supporting substrates above any form of chuck including non-ceramic electrostatic chucks, mechanical clamping chucks, and the like. One important feature of the invention is that the stand-off be fabricated from a polymeric material such as polyimide or a fluoropolymer that has contact properties that are different from the chuck material.

In the preferred embodiment, the electrostatic chuck 100 contains one or more electrodes 116 imbedded within a ceramic chuck body 112. The ceramic chuck body is, for example, fabricated of aluminum-nitride or boron-nitride. Such a partially conductive ceramic material promotes the Johnsen-Rahbek effect which retains the wafer during high temperature processing. Other partially conductive ceramics also form useful high temperature chuck materials such as alumina doped with a titanium oxide or a chromium oxide. If the chuck is to be used at low temperatures only, then other ceramic and/or dielectric materials such as alumina are used to form the chuck body. An illustrative ceramic electrostatic chuck is disclosed in commonly assigned U.S. Pat. No. 5,511,799 issued Apr. 30, 1996, herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

The stand-off pad 102 is comprised of a plurality of islands 206 positioned on the support surface 114 of the chuck 100. Typically, each island has a diameter of approximately 10–200 μm, spaced equidistantly from one another and, depending upon the size and spacing of the islands, contact between 5% to 75% of the underside surface of the wafer. Preferably, the islands contact approximately 10% to 25% of the surface area of the wafer. Generally, the number, spacing and size of the islands is determined by the amount of clamping force applied by the electrostatic chuck. For example, if the amount of force is large and the islands are spaced relatively distant from one another, the wafer may bow between the islands. Consequently, for large clamping forces, the islands should either be relatively large or positioned near one another.

FIG. 2 depicts a top plan view of a pattern for an illustrative stand-off pad. As depicted using solid lines, a plurality of individual islands 206 collectively form the pad 102. Alternatively, the islands 206 are interconnected by connecting strips 202 and 204 (shown in phantom) to form a web 208. More specifically, the connecting strips are a plurality of concentric rings 202 and radially extending connector strips 204. The rings, for example, are spaced from one another by approximately 0.64 cm. Also, the rings and/or the radial strips could each be used separately as the wafer stand-off pad with or without islands 206.

The key feature of the invention is that the wafer is supported in a spaced-apart relation to the surface of the chuck by a stand-off pad. The particular stand-off pad pattern and pad material is defined by the particular application for the chuck. chucking voltage, chucking force, wafer thickness, the chuck electrode pattern, the particular process that the wafer is to be subjected and the like, are such factors.

Typically, the stand-off pad 102 is disposed upon the support surface 114 of the chuck body 112 by dispensing a polymer solution using a drop dispenser. After dispensing the polymer solution, the polymer is dried and cured. This method produces the plurality of individual support pads (islands 206) that are permanently adhered to the support surface of the chuck.

The stand-off pad may also be formed by spin coating the polymeric material onto the chuck surface. The coating of polymer may then be selectively etched to remove unwanted polymeric material and leave the stand-off pad on the support surface. The stand-off pad may be etched to form individual islands 206 or a web 208 of interconnected islands. Other methods such as decal transfer or stencil intaglio printing methods may also be used to form the stand-off pad.

To produce the web 205, a pattern is die cut from a sheet of polymeric material. A stand-off pad having a web pattern does not require attachment to the chuck surface by an adhesive. As such, the web is easily removed from the surface of the chuck for cleaning or replaced by another stand-off pad when worn or otherwise damaged. Alternatively, the stand-off pad can be formed by dip coating a die-cut core of a thin metal sheet, such as aluminum, in a solution of a polymer, such as polyimide, dissolved in a solvent, such as N-methyl pyrrolidine (NMP). The metal core adds support to the web, aiding in its placement on and removal from the ceramic surface.

The material of the stand-off pad has superior contact properties as compared to the surface material of the chuck. For example, the stand-off pad material is less abrasive and more compliant, i.e., produces less particles, than the surface material of the chuck. Furthermore, selecting a compliant material also prevents breakage of the wafer. During rapid wafer transport in the semiconductor processing system, wafers may break upon placement on the chuck. Preferably, the material chosen for the wafer stand-off pad is a material that absorbs the shock of the wafer placed on the stand-off pad. Typically, the material used to form the stand-off pad is a polymeric material such as polyimide or some other material that has similar properties, such as TEFLON® or other fluoropolymers.

The pad has a pre-defined thickness that maintains the wafer 106, or other workpiece, above the support surface 114 such that particles 110 on the support surface do not contact the wafer surface. An illustrative thickness is approximately 50 microns. The stand-off pad is easily cleaned to ensure that any surfaces that contact the wafer 106 are substantially free of contaminants. Importantly, the contaminants tend to become trapped in the spaces 120 defined by the stand-off pad.

To facilitate heat transfer from the wafer to the chuck body, a heat transfer medium, e.g., a gas such as helium, is pumped into the space 120 between the backside surface of the wafer 108 and the support surface 114 of the chuck body 112. This cooling technique is known as "backside cooling". The heat transfer medium is provided via a port 320 that is formed through the chuck body 112. The medium is typically supplied to the underside of the wafer at a rate of 2–30 sccm. The medium generally flows from the port 320 outward toward the edge of the wafer and escapes into the reaction chamber environment. Such backside cooling is well-known in the art and is disclosed, for example, in commonly assigned U.S. Pat. No. 5,228,501, issued to Tepman et al. on Jul. 20, 1993. Importantly, when backside cooling is used, the wafer stand-off pad pattern has a dual purpose: (1) to support the wafer to reduce backside particle adherence and (2) to create heat transfer medium distribution channels upon the support surface of the chuck. However, additional heat transfer medium distribution channels (not shown) may be formed in the surface of the chuck body to further aid distribution of the heat transfer medium across the underside of the wafer 106. Such patterns of backside gas distribution channels vary in design and complexity, depending upon the application of the chuck.

Figure 3:
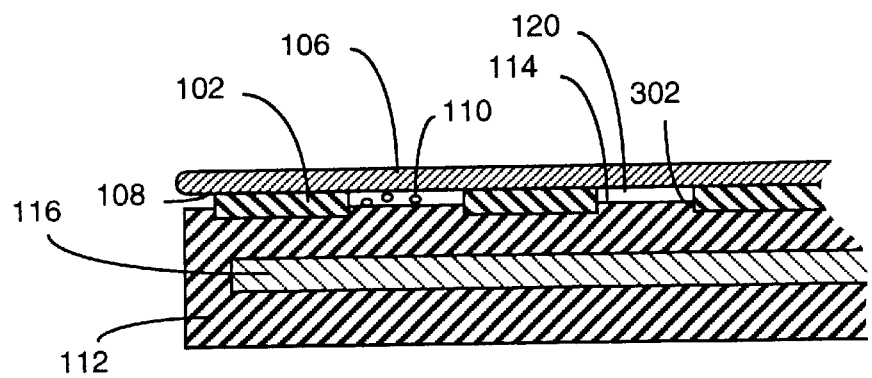
FIG. 3 depicts a cross-sectional view of a stand-off pad of the present invention, disposed on a corresponding patterned recess in the surface of a chuck, supporting a wafer.

FIG. 3 depicts a cross-sectional view of a stand-off pad 102 of the present invention, disposed in a recess 302 formed in the surface of a chuck 114. Specifically, the recess 302 in the chuck surface is patterned to match the pattern of the pad 102. The recess 302 in the surface of the ceramic chuck has a depth less than the thickness of the wafer stand-off pad. The recess is milled, or otherwise formed, in the surface of the chuck. Preferably, the depth of the recess is 5–100 $\mu$m less then the thickness of the wafer stand-off pad. As such, the stand-off pad projects above the surface of the chuck. Placing the stand-off pad in the recess aids in securing the stand-off pad to the chuck, and prevents movement of the stand-off pad during processing. The recessed pattern may also correspond to the backside gas distribution channels in the chuck surface.

Using the stand-off pad in conjunction with a ceramic chuck has resulted in substantially decreased particulate contamination of wafers. Empirical data shows that a conventional ceramic chuck supporting a wafer directly upon its support surface can transfer tens of thousands of particles to the underside of a wafer. However, using the stand-off pad of the present invention reduces the particle count for particles located on the underside of a wafer to hundreds of particles. Importantly, the wafer stand-off pad does not significantly interfere with the clamping process or impact the clamping force that retains the wafer upon the chuck.

Although various embodiments which incorporate the teachings of the present invention have been shown and described in detail herein, those skilled in the art can readily devise many other varied embodiments that still incorporate these teachings.

What is claimed is:

1. A stand-off pad comprising:
   a removable polymeric material layer for supporting a workpiece in a spaced-apart relation to a support surface of a workpiece support chuck, wherein said polymeric material layer is patterned to form a web.

2. The stand-off pad of claim 1, wherein said polymeric material layer is polyimide.

3. The stand-off pad of claim 1, wherein said web comprises:
   a plurality of islands; and
   a plurality of connector strips.

4. The stand-off pad of claim 1, wherein said web comprises a patterned metallic core coated with a polymeric material.

5. A apparatus for supporting a workpiece comprising:
   a workpiece support chuck, having an insulating support surface; and
   a removable stand-off pad being a polymeric material layer disposed upon said support surface, the pad adapted to maintain the workpiece in a spaced-apart relation to the support surface, wherein said polymeric material layer is patterned to form a web.

6. The apparatus of claim 5, wherein said polymeric material layer is polyimide.

7. The apparatus of claim 5, wherein said support surface said workpiece support chuck has a patterned recess.

8. The apparatus of claim 7, wherein said patterned recess corresponds to the shape of the stand-off pad, said stand-off pad disposed in said recess pattern.

9. The apparatus of claim 5, wherein said web comprises a patterned metallic core coated with a polymeric material.

10. The apparatus of claim 5, wherein said web comprises:
    a plurality of islands; and
    a plurality of connector strips.

11. The apparatus of claim 5, wherein said polymeric material layer is patterned to form a plurality of islands.

* * * * *